US012666623B2

(12) United States Patent
Kong

(10) Patent No.: US 12,666,623 B2
(45) Date of Patent: Jun. 23, 2026

(54) SEMICONDUCTOR DEVICE AND METHOD OF MANUFACTURING SEMICONDUCTOR DEVICE

(71) Applicant: SK hynix Inc., Gyeonggi-do (KR)

(72) Inventor: Hee Sung Kong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 80 days.

(21) Appl. No.: 18/641,435

(22) Filed: Apr. 22, 2024

(65) Prior Publication Data

US 2025/0234555 A1 Jul. 17, 2025

(30) Foreign Application Priority Data

Jan. 16, 2024 (KR) ........................ 10-2024-0006842

(51) Int. Cl.
| | |
|---|---|
| *G11C 11/22* | (2006.01) |
| *G11C 5/06* | (2006.01) |
| *H10B 51/20* | (2023.01) |
| *H10B 51/30* | (2023.01) |
| *H10D 30/01* | (2025.01) |
| *H10D 30/69* | (2025.01) |

(52) U.S. Cl.
CPC ............. *H10B 51/20* (2023.02); *G11C 5/063* (2013.01); *G11C 11/2275* (2013.01); *H10B 51/30* (2023.02); *H10D 30/0415* (2025.01); *H10D 30/701* (2025.01)

(58) Field of Classification Search
CPC ........ H10B 51/20; H10B 51/30; G11C 5/063; G11C 11/2275; G11C 16/08; G11C 16/10; G11C 16/24; H10D 30/0415; H10D 30/701; H10D 64/689

USPC ................................................... 365/145, 158
See application file for complete search history.

(56) References Cited

U.S. PATENT DOCUMENTS

| | | | | |
|---|---|---|---|---|
| 9,018,054 | B2 * | 4/2015 | Yoshida ................. | H10D 30/62 |
| | | | | 438/163 |
| 10,211,223 | B2 | 2/2019 | Van Houdt et al. | |
| 10,950,623 | B2 * | 3/2021 | Song ................... | G11C 16/0483 |
| 11,387,146 | B2 * | 7/2022 | Min ................... | H10D 84/0158 |
| 2017/0040331 | A1 * | 2/2017 | Van Houdt .......... | H10D 64/689 |

(Continued)

FOREIGN PATENT DOCUMENTS

| | | | | |
|---|---|---|---|---|
| CN | 110326111 | A | * 10/2019 | ........... H10D 30/701 |
| CN | 114955974 | A | * 8/2022 | ......... H01H 59/0009 |

(Continued)

OTHER PUBLICATIONS

Y. Goh et al., Selector-less Ferroelectric Tunnel Junctions by Stress Engineering and an Imprinting Effect for High-Density Cross-Point Synapse Arrays, ACS Applied Materials & Interfaces, Dec. 2, 2021, pp. 59422-59430, 13.

(Continued)

*Primary Examiner* — Michael T Tran
(74) *Attorney, Agent, or Firm* — IP & T GROUP LLP

(57) ABSTRACT

A semiconductor device may include a gate structure including conductive layers and insulating layers alternately stacked, a metal channel layer extending through the gate structure, a first semiconductor channel layer extending through the gate structure and connecting to the metal channel layer, and a ferroelectric layer surrounding the metal channel layer and the first semiconductor channel layer.

21 Claims, 19 Drawing Sheets

(56)        References Cited

U.S. PATENT DOCUMENTS

2021/0296469  A1 *    9/2021   Lai ..................... H10D 30/0415
2022/0302169  A1 *    9/2022   Takagi .................. H10B 51/20

FOREIGN PATENT DOCUMENTS

| CN | 116259654 A | * | 6/2023 | ......... H10D 30/6757 |
|---|---|---|---|---|
| CN | 116438634 A | * | 7/2023 | ......... H10D 30/6734 |
| KR | 10-2020-0056877 A | | 5/2020 | |
| KR | 20210111146 A | * | 9/2021 | ............. H10D 30/69 |

OTHER PUBLICATIONS

Y. Jeong et al., Oxygen Vacancy Control as a Strategy to Enhance Imprinting Effect in Hafnia Ferroelectric Devices, IEEE Transactions on Electron Devices, Jan. 2023, pp. 354-359, vol. 70, No. 1.

\* cited by examiner

SEMICONDUCTOR DEVICE AND METHOD OF MANUFACTURING SEMICONDUCTOR DEVICE

CROSS-REFERENCE TO RELATED APPLICATION

This application claims priority under 35 U.S.C. § 119 to Korean Patent Application No. 10-2024-0006842 filed on Jan. 16, 2024, which is incorporated herein by reference in its entirety.

BACKGROUND

1. Technical Field

Embodiments of the present disclosure relate to an electronic device, and more particularly, to a semiconductor device and a method of manufacturing the semiconductor device.

2. Related Art

An integration degree of a semiconductor device is mainly determined by a region occupied by a unit memory cell. Recently, as improvements in the integration degree of a semiconductor device in which a memory cell is formed as a single layer on a substrate reach a limit, a three-dimensional semiconductor device in which memory cells are stacked on a substrate has been proposed. In addition, various structures and manufacturing methods are being developed for improving the operation reliability of the three-dimensional semiconductor devices.

SUMMARY

According to an embodiment of the present disclosure, a three-dimensional semiconductor device (hereinafter referred to simply as semiconductor device) may include a gate structure including conductive layers and insulating layers alternately stacked, a metal channel layer extending through the gate structure, a first semiconductor channel layer positioned in the gate structure and connecting to the metal channel layer, and a ferroelectric layer surrounding the metal channel layer and the first semiconductor channel layer.

According to an embodiment of the present disclosure, a semiconductor device may include bit lines, memory strings including ferroelectric memory cells including a metal channel layer and a drain select transistor including a first semiconductor channel layer, word lines connected to the ferroelectric memory cells, and drain select lines connected to the drain select transistor and controlling a connection of the memory strings and the bit lines.

According to an embodiment of the present disclosure, a method of manufacturing a semiconductor device may include forming a stack including first material layers and second material layers alternately stacked, forming a first opening in the stack, forming a ferroelectric layer in the first opening, forming a metal channel layer in the ferroelectric layer, forming a second opening by partially etching the metal channel layer, and forming a first semiconductor channel layer in the second opening.

According to an embodiment of the present disclosure, a method of manufacturing a semiconductor device may include forming a source line, forming a source select line on the source line, forming a stack including first material layers and second material layers alternately stacked on the source select line, forming an opening extending through the stack and the source select line into the source line, forming a second semiconductor channel layer passing through the source select line and connecting to the source line, in the opening, forming a metal channel layer extending through the stack and connecting to the second semiconductor channel layer, in the opening, and forming a first semiconductor channel layer extending through the stack and connecting to the metal channel layer, in the opening.

DETAILED DESCRIPTION

Various embodiments of the present disclosure provides a semiconductor device and a method of manufacturing the semiconductor device having a stable structure and an improved characteristic.

An integration degree of a semiconductor device may be improved by stacking memory cells in a three dimension. In addition, a semiconductor device with a stable structure and improved reliability may be provided.

Hereinafter, embodiments according to the technical spirit of the present disclosure are described with reference to the accompanying drawings.

Figure 1:
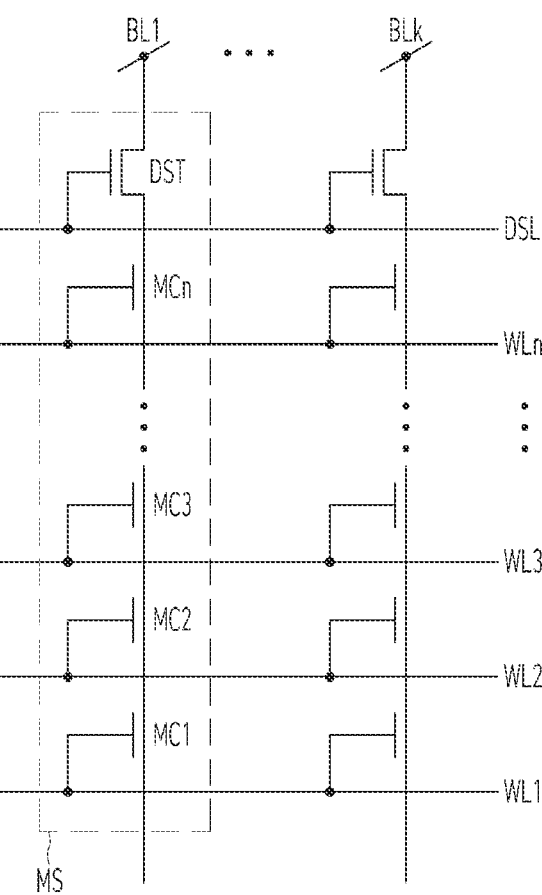
FIG. 1 is a circuit diagram illustrating a cell array of a semiconductor device according to an embodiment of the present disclosure.

FIG. 1 is a circuit diagram illustrating a cell array of a semiconductor device according to an embodiment of the present disclosure.

Referring to FIG. 1, the semiconductor device may include bit lines BL1 to BLk, memory strings MS, word lines WL1 to WLn, and a drain select line DSL. Each of the memory strings MS may include at least one drain select transistor DST and a plurality of ferroelectric memory cells MC1 to MCn. Here, the ferroelectric memory cells MC1 to MCn may be ferroelectric tunnel junction (FTJ) elements. The word lines WL1 to WLn may be connected to gate electrodes of the ferroelectric memory cells MC1 to MCn. The drain select line DSL may be connected to gate electrodes of the drain select transistors DST. Here, k and n may be integers of 1 or more.

The drain select transistors DST may control a connection of the memory strings MS and the bit line BL. The drain select transistor DST may include a semiconductor channel layer. In an embodiment, the semiconductor channel layer may include polysilicon.

The ferroelectric memory cells MC1 to MCn may store data according to a polarization state of a ferroelectric layer. The ferroelectric memory cells MC1 to MCn may include a channel layer having carrier mobility greater than that of the semiconductor channel layer of the drain select transistor DST. The ferroelectric memory cells MC1 to MCn may include a metal channel layer. In an embodiment, the metal channel layer may include a metal such as, for example, titanium or tungsten.

According to the configuration described above, a memory integration degree of the semiconductor device may be increased by increasing the number of ferroelectric memory cells MC1 to MCn included in the memory string MS. Because the ferroelectric memory cells MC1 to MCn include a metal channel layer having great carrier mobility, an operation speed may be improved. In addition, a selected memory string and an unselected memory string may be distinguished and operated, by using the drain select transistor DST as a switch.

Furthermore, a cell array according to an embodiment of the present disclosure may be used for an analog computing in memory operation. Referring to Equation 1, an output vector output through the bit line BL may be calculated, by performing a multiply accumulate (MAC) operation by mapping a voltage applied to the word lines WL1 to WLn to an input vector and mapping a conductance of a ferroelectric memory cell MC to a weight vector. Therefore, an analog operation required for an AI operation may be performed inside a memory using the cell array.

$$\text{Output}_k = \sum_{i=1}^{n} \frac{1}{R} V_{WLk} \qquad \text{[Equation 1]}$$

Figure 2A:
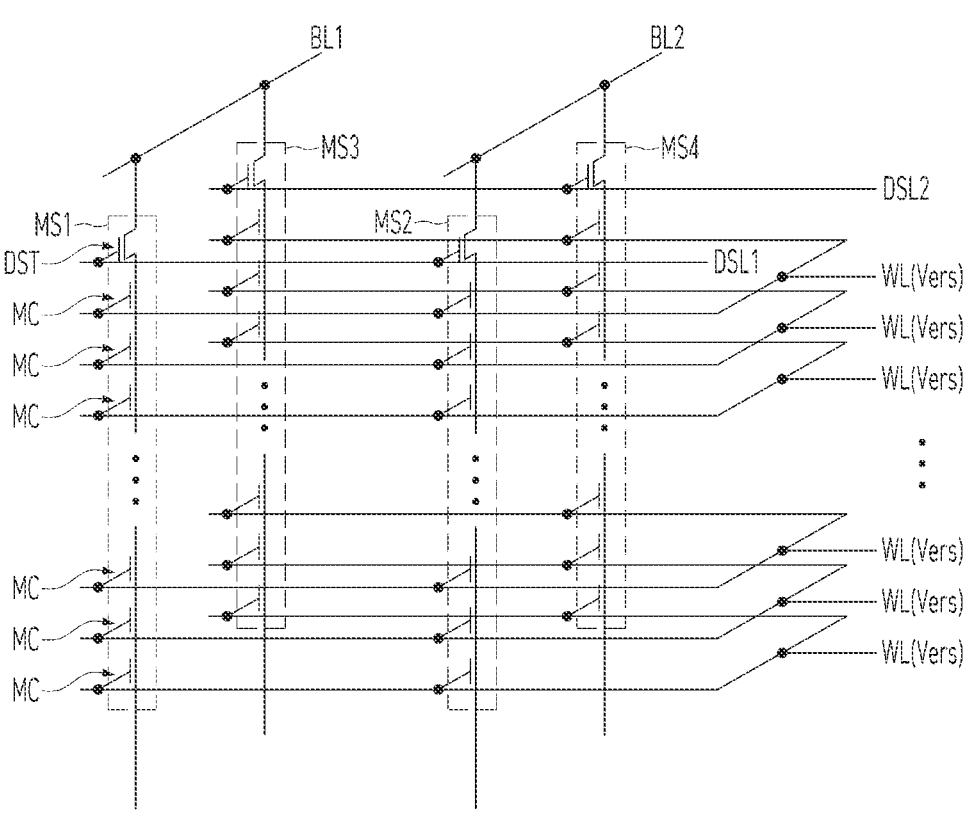
FIGS. 2A and 2B are diagrams illustrating a method of operating a semiconductor device according to an embodiment of the present disclosure.
Figure 2B:
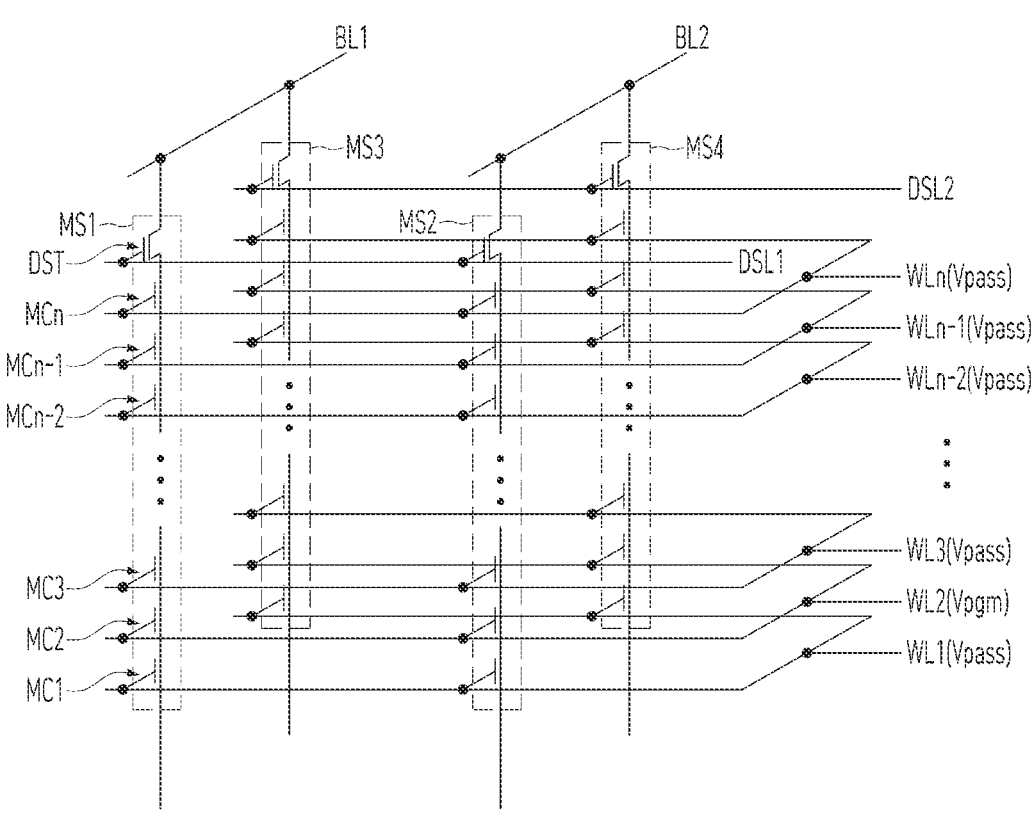

FIGS. 2A and 2B are diagrams illustrating a method of operating a semiconductor device according to an embodiment of the present disclosure. Hereinafter, a description overlapping a content described above may be omitted.

Referring to FIG. 2A, during an erase operation, a turn-on voltage may be applied to drain select lines DSL1 and DSL2 and a ground voltage may be applied to bit lines BL1 and BL2. Here, the turn-on voltage may be about 2V. Through this, memory strings MS1 to MS4 may be connected to the bit lines BL1 and BL2, and a channel potential of the memory strings MS1 to MS4 may have a ground level. An erase voltage Vers may be applied to the word lines WL1 to WLn. Here, the erase voltage Vers may be a negative voltage. Through this, the ferroelectric layer of the ferroelectric memory cells MC1 to MCn may have a first polarization state. Therefore, an erase operation may be performed on all memory strings MS1 to MS4 belonging to a memory block.

Referring to FIG. 2B, during a program operation, a turn-on voltage may be applied to a selected first drain select line DSL1 and a first bit line voltage may be applied to a selected first bit line BL1. Here, the first bit line voltage may be a ground voltage. Through this, a channel potential of a selected first memory string MS1 may have a ground level.

A program voltage Vpgm may be applied to a selected word line WL2, and a pass voltage Vpass may be applied to unselected word lines WL1 and WL3 to WLn. Here, the program voltage Vpgm may be a positive voltage, and the pass voltage Vpass may be Vpgm/2. Through this, a ferroelectric layer of the selected second memory cell MC2 may have a second polarization state by the program voltage Vpgm. Therefore, a program operation may be performed on the selected second memory cell MC2.

Meanwhile, among unselected memory strings MS2 to MS4, the second memory string MS2 may share the first drain select line DSL1 with the selected first memory string MS1, and might not share the first bit line BL1. Therefore, the second bit line voltage higher than the first bit line voltage may be applied to an unselected second bit line BL2. Here, the second bit line voltage may be an operation voltage Vcc. Through this, the drain select transistor DST may be turned off and a channel of the second memory string MS2 may be floated. The floated channel may be boosted relative to the program voltage Vpgm and the pass voltage Vpass, and may inhibit a program operation of the unselected second memory string MS2.

Among the unselected memory strings MS2 to MS4, the third memory string MS3 might not share the first drain select line DSL1 with the selected first memory string MS1, and may share the first bit line BL1. Therefore, the ground voltage may be applied to an unselected second drain select line DSL2, and may inhibit a program operation of the unselected third memory string MS3.

Among the unselected memory strings MS2 to MS4, the fourth memory string MS4 might not share the first drain select line DSL1 with the selected first memory string MS1, and might not share the first bit line BL1. The ground voltage may be applied to the unselected second drain select line DSL2, and the second bit line voltage higher than the first bit line voltage may be applied to the unselected second bit line BL2. In an embodiment, the second bit line voltage may be Vpgm/2. Through this, a program operation of the unselected fourth memory string MS4 may be inhibited.

Figure 3A:
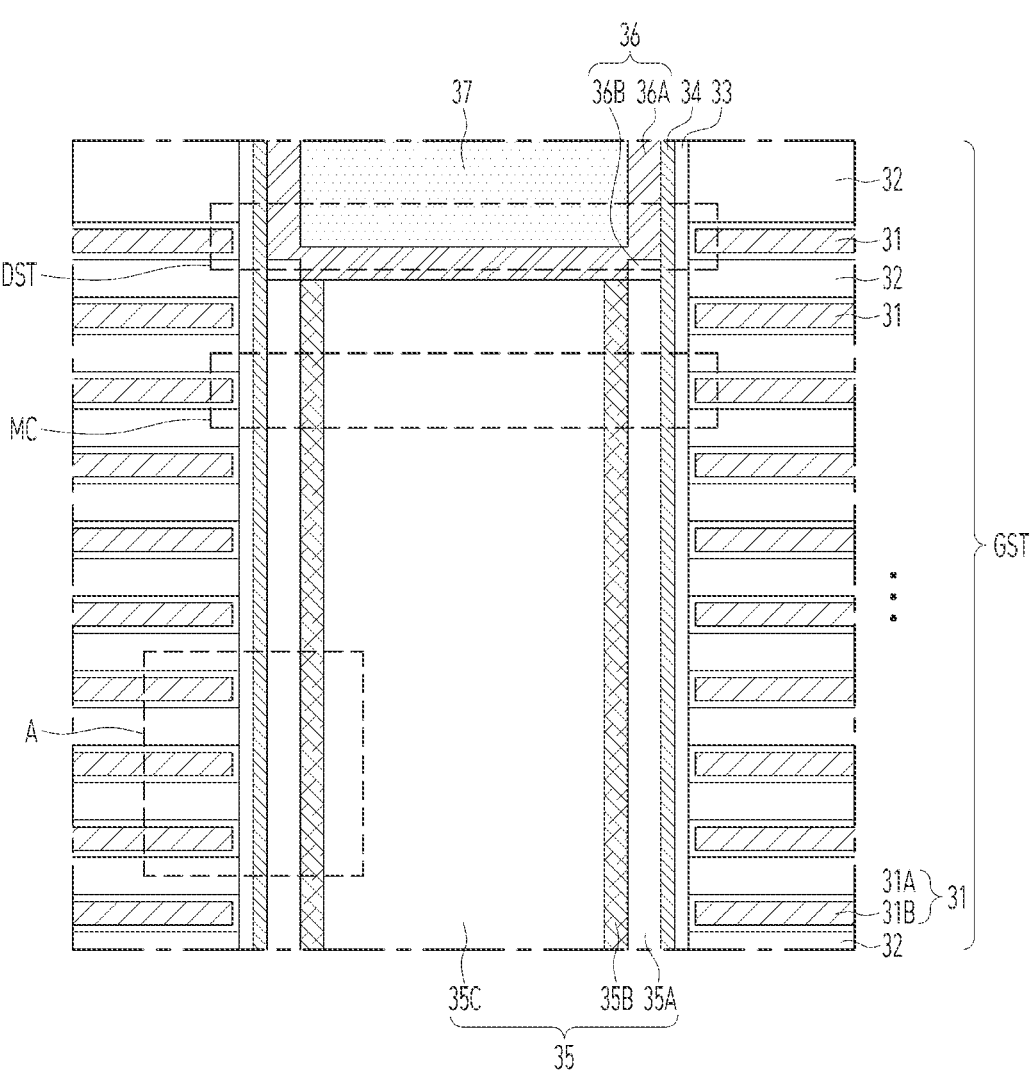
FIGS. 3A to 3C are diagrams illustrating a structure and an operation of a semiconductor device according to an embodiment of the present disclosure.
Figure 3B:
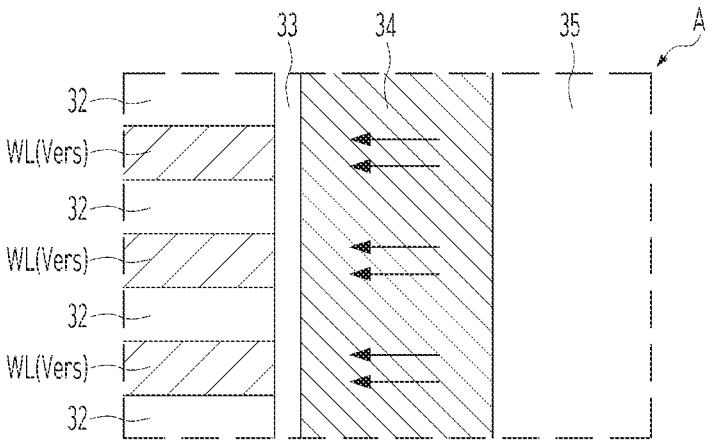
Figure 3C:
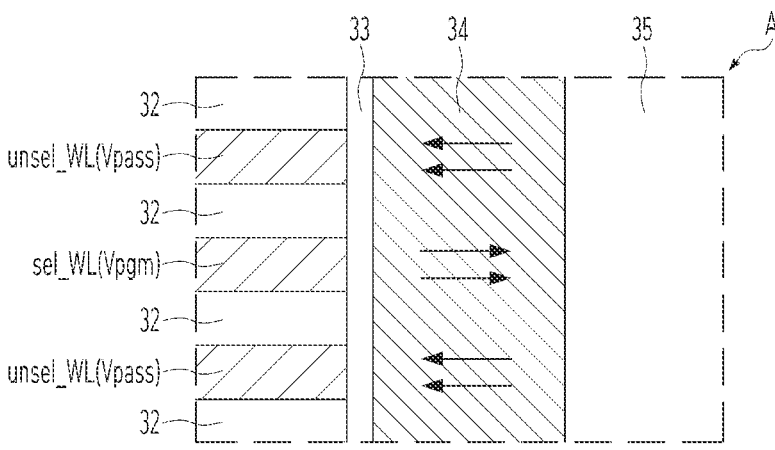

FIGS. 3A to 3C are diagrams illustrating a structure and an operation of a semiconductor device according to an embodiment of the present disclosure. FIGS. 3B and 3C are enlarged views of a region A in FIG. 3A. Hereinafter, a description overlapping a content described above may be omitted.

Referring to FIG. 3A, the semiconductor device may include a gate structure GST, a metal channel layer 35, a first semiconductor channel layer 36, and a ferroelectric layer 34. The semiconductor device may further include at least one of an interface layer 33 and an insulating core 37.

The gate structure GST may include conductive layers 31 and insulating layers 32 alternately stacked. The ferroelectric layer 34 may pass through the gate structure GST. The metal channel layer 35 may extend through a lower portion of the gate structure GST while the first semiconductor channel layer 36 may extend through an upper portion of the gate structure GST. The first semiconductor channel layer 36 may be positioned over the metal channel layer with a lower surface of the first semiconductor channel layer 36 contacting an outer portion (side portion 35A) of an upper surface of the metal channel layer 35.

The ferroelectric layer 34 may laterally surround a side of the metal channel layer 35 and a side of the first semiconductor channel layer 36.

In an embodiment, the conductive layers 31 may be word lines and/or a drain select line. In an embodiment, at least one uppermost conductive layer 31 among the conductive layers 31 may be the drain select line, and remaining conductive layers 31 may be the word lines. The conductive layers 31 may include a conductive material such as, for example, polysilicon, tungsten (W), or molybdenum (Mo). In an embodiment, the conductive layer 31 may include a barrier layer 31A and a metal layer 31B in the barrier layer 31A. The barrier layer 31A may include a metal nitride such as, for example, titanium nitride (TiN), and the metal layer 31B may include tungsten (W).

The metal channel layer 35 may extend through the gate structure GST. The metal channel layer 35 may include a first metal layer 35A, a barrier layer 35B, and a second metal layer 35C all of which are also extending through the gate structure GST in a direction perpendicular to the conductive layers 31 and insulating layers 32. The barrier layer 35B may surround the second metal layer 35C, and the first metal layer 35A may surround the barrier layer 35B. In an embodiment, the first metal layer 35A may include titanium (Ti), the barrier layer 35B may include a metal nitride such as, for example, titanium nitride (TiN), and the second metal layer 35C may include tungsten (W).

The first semiconductor channel layer 36 may be positioned in the gate structure GST. The first semiconductor channel layer 36 may be positioned over the metal channel layer 35. The first semiconductor channel layer 36 may extend through the gate structure GST and may be connected to the metal channel layer 35. The first semiconductor channel layer 36 may include a polysilicon layer 36A and a metal silicide layer 36B. The metal silicide layer 36B may be positioned between the polysilicon layer 36A and the metal channel layer 35. FIG. 3A shows an embodiment in which the metal silicide layer 36B is formed at an interface between the first metal layer 35A and the first semiconductor channel layer 36, but the metal silicide layer may be formed at an interface between the barrier layer 35B and the first semiconductor channel layer 36 or at an interface between the second metal layer 35C and the first semiconductor channel layer 36. During a silicidation reaction, reactivity of the first metal layer 35A, the barrier layer 35B, and the second metal layer 35C may be different, and the metal silicide layer 36B of a relatively thick thickness may be formed at the interface between the first metal layer 35A and the first semiconductor channel layer 36. An ohmic contact may be formed between the first semiconductor channel layer 36 and the metal channel layer 35 by the metal silicide layer 36B.

The insulating core 37 may be positioned in the first semiconductor channel layer 36. The first semiconductor channel layer 36 may surround a sidewall of the insulating core 37 and extend between the insulating core 37 and the metal channel layer 35. In an embodiment, the insulating core 37 may include an insulating material such as, for example, oxide or nitride.

The ferroelectric layer 34 may surround the first semiconductor channel layer 36 and the metal channel layer 35. The ferroelectric layer 34 may include hafnium oxide (HfO), hafnium zirconium oxide (HfZrO), or the like.

The interface layer 33 may surround the ferroelectric layer 34. The interface layer 33 may include a dielectric material such as, for example, tantalum oxide ($Ta_2O_5$). When a high-pressure heat treatment process is performed after forming a tantalum oxide layer, an oxygen bond in the tantalum oxide layer may be broken and a positive ionized oxygen vacancy $Vo++$ may be generated. An imprinting field may be applied to the ferroelectric layer 34 due to the oxygen vacancy $Vo++$ in the interface layer 33, and the ferroelectric memory cell may have a self-rectifying characteristic.

According to the structure described above, the ferroelectric memory cells MC may be positioned in a region where the metal channel layer 35 and the conductive layers 31 cross. The ferroelectric memory cells MC may be stacked along the metal channel layer 35. The drain select transistor DST may be positioned in a region where the first semiconductor channel layer 36 and the conductive layers 31 cross. The ferroelectric memory cells MC and at least one drain select transistor DST stacked along the metal channel layer 35 and the first semiconductor channel layer 36 connected to each other may configure one memory string.

Referring to FIG. 3B, during an erase operation, the erase voltage Vers may be applied to the word lines WL, and the ferroelectric layer 34 may be polarized to the first polarization state by the erase voltage Vers. Therefore, the erase operation may be performed on the ferroelectric memory cells MC included in the memory block at once.

Referring to FIG. 3C, during a program operation, the program voltage Vpgm may be applied to a selected word line sel_WL, and the pass voltage Vpass may be applied to unselected word lines unsel_WL. Through this, the ferroelectric layer 34 of selected ferroelectric memory cell MC may be switched to the second polarization state, and the ferroelectric layer 34 of unselected ferroelectric memory cells MC may maintain the first polarization state. Therefore, the program operation may be performed only on the selected ferroelectric memory cell MC.

Figure 4A:
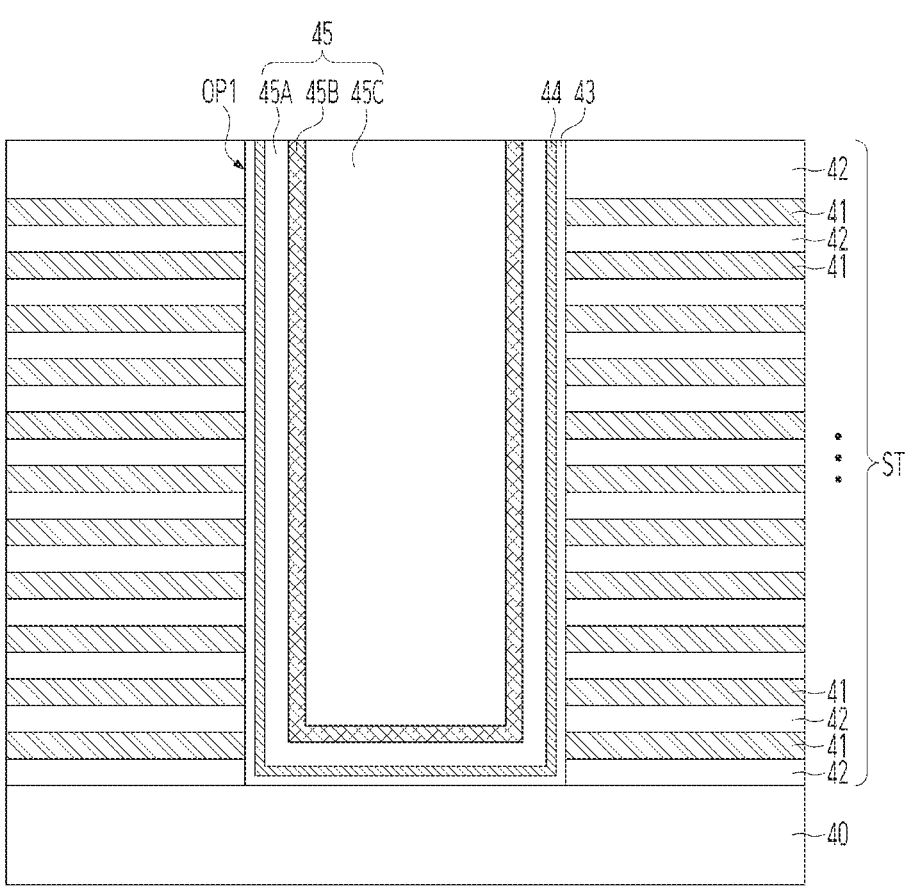
FIGS. 4A to 4C are diagrams illustrating a method of manufacturing a semiconductor device according to an embodiment of the present disclosure.
Figure 4B:
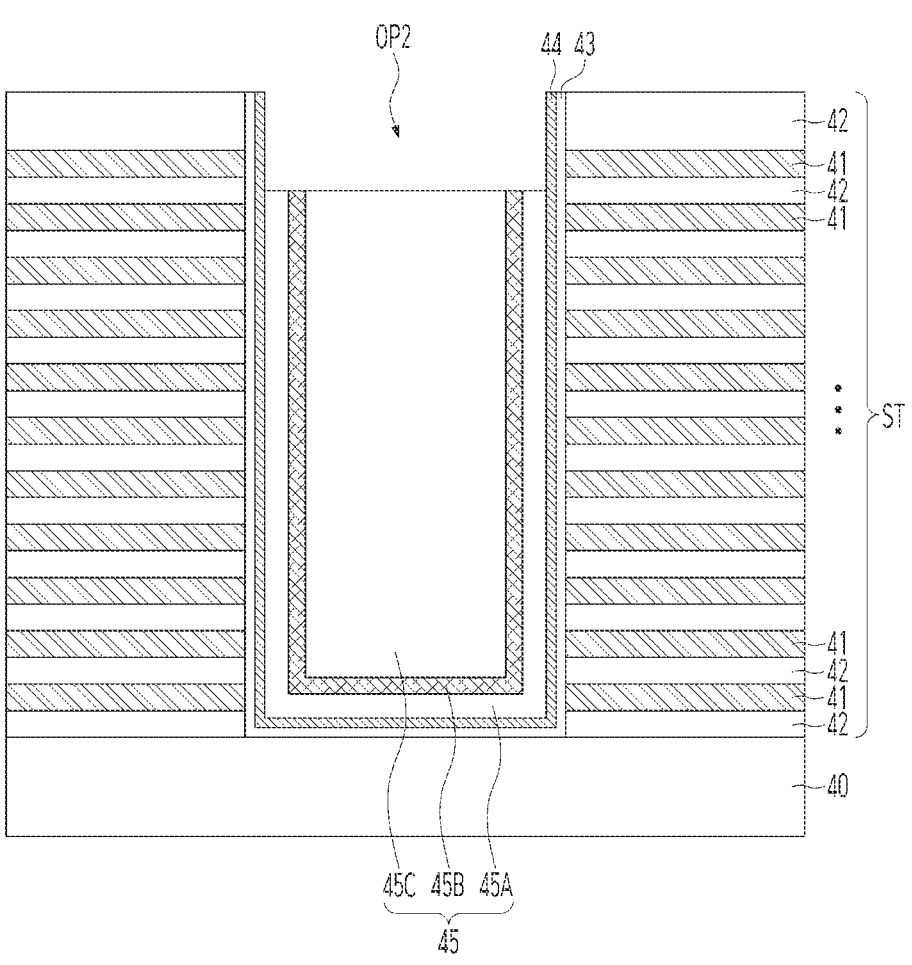
Figure 4C:
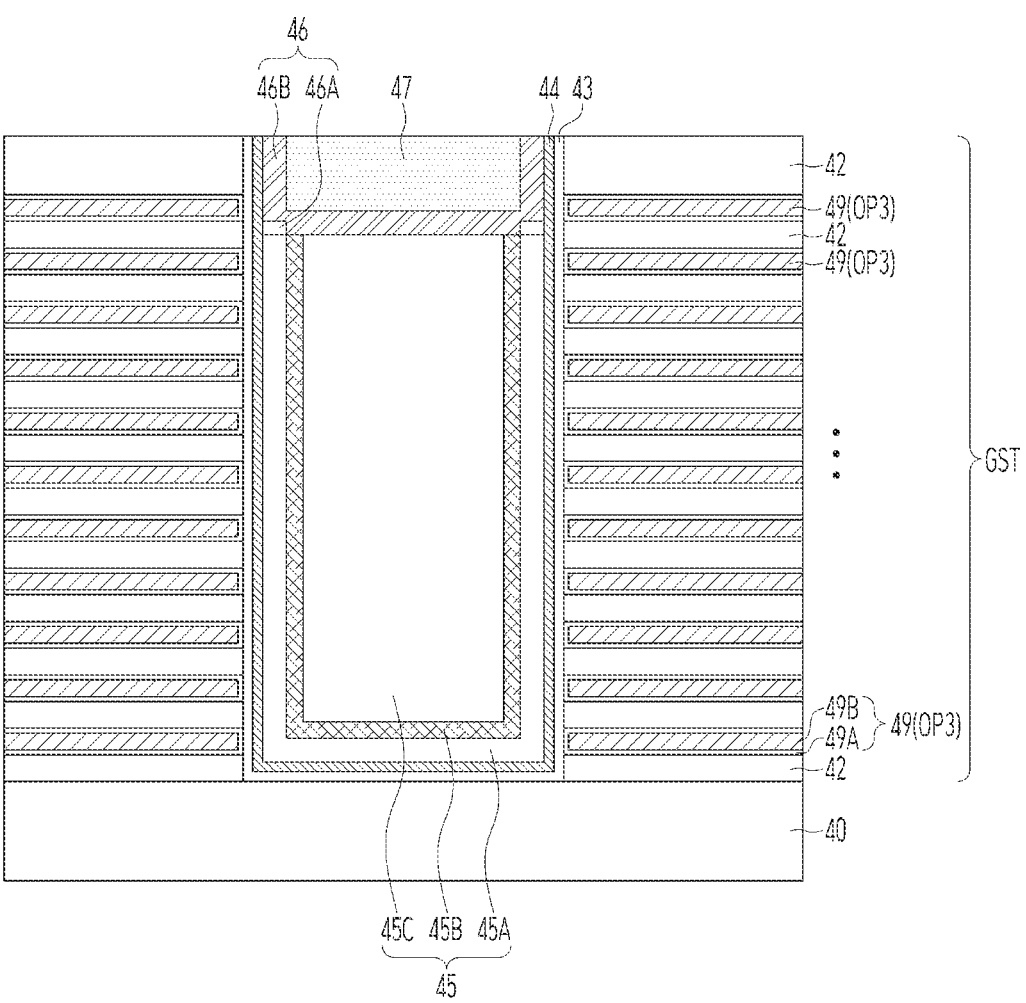

FIGS. 4A to 4C are diagrams illustrating a method of manufacturing a semiconductor device according to an embodiment of the present disclosure. Hereinafter, a description overlapping a content described above may be omitted.

Referring to FIG. 4A, a stack ST may be formed on a substrate 40. The stack ST may include first material layers 41 and second material layers 42 alternately stacked over the substrate 40. The lowest second material layer 42 may be in contact with the substrate 40. The uppermost second material layer 42 may be the uppermost layer of the stack ST. The first material layers 41 may be used for forming a gate line such as, for example, a word line and a drain select line. In an embodiment, at least one uppermost first material layer 41 may be for forming the drain select line, and remaining first material layers 41 may be for forming the word lines. The first material layers 41 may include a sacrificial material such as, for example, a nitride or a conductive material such as, for example, polysilicon or metal. The second material layers 42 may insulate the stacked gate lines from each other. The second material layers 42 may be also for insulating the stack ST from the substrate 40 and from a structure positioned over the stack ST. The second material layers 42 may include an insulating material such as, for example, oxide, or a nitride. The second material layers 42 may include an air gap. Subsequently, a first opening OP1 may be formed in the stack ST. The first opening OP1 may extend through the stack ST and may have a depth that exposes the substrate 40. Subsequently, an interface layer 43 may be formed in the first opening OP1. The interface layer 43 may be formed conformally along an inner surface of the first opening OP1. The interface layer 43 may be formed conformally on the inner wall and the lower surface of the first opening OP1. The lower surface of the first opening refers to the bottom wall surface of the first opening OP1. The interface layer 43 may include a dielectric material such as, for example, tantalum oxide ($Ta_2O_5$).

Subsequently, a ferroelectric layer 44 may be formed in the first opening OP1. The ferroelectric layer 44 may be formed conformally along a profile of the interface layer 43. The ferroelectric layer 44 may be formed on the inner wall and the lower surface of the first opening OP1.

Subsequently, a metal channel layer 45 may be formed in the first opening OP1. The metal channel layer 45 may be formed to fill the first opening OP1. The metal channel layer 45 may be formed as a single layer or multiple layers. The metal channel layer 45 may include a first metal layer 45A, a barrier layer 45B, and a second metal layer 45C. In an embodiment, the first metal layer 45A may be formed conformally along a profile of the ferroelectric layer 44, the barrier layer 45B may be formed conformally along a profile of the first metal layer 45A, and the second metal layer 45C may be formed in the barrier layer 45B. The barrier layer 45B may surround a sidewall and a lower surface of the second metal layer 45C, and the first metal layer 45A may surround a sidewall and a lower surface of the barrier layer 45B. The ferroelectric layer 44 may surround a sidewall and a lower surface of the metal channel layer 45.

Referring to FIG. 4B, a second opening OP2 may be formed by etching a portion of the metal channel layer 45. In an embodiment, the metal channel layer 45 may be etched using a wet etching process. A portion of the metal channel layer 45 corresponding to the drain select line may be removed.

Referring to FIG. 4C, a first semiconductor channel layer 46 may be formed in the second opening OP2. The first semiconductor channel layer 46 may be formed conformally along an inner surface of the second opening OP2. The first semiconductor channel layer 46 may be formed conformally along a profile of the ferroelectric layer 44 and the metal channel layer 45. In an embodiment, after forming the first semiconductor channel layer 46 by depositing a polysilicon layer, a heat treatment process may be performed. Through the heat treatment process, silicon of the first semiconductor channel layer 46 and a metal of the metal channel layer 45 may react, and a metal silicide layer 46A may be formed through a silicidation reaction. The metal silicide layer 46A may be formed at a portion of the first semiconductor channel layer 46, which is in contact with the metal channel layer 45. Through this, the first semiconductor channel layer 46 may be partially silicided, and an ohmic contact may be formed between the metal channel layer 45 and the first semiconductor channel layer 46. In an embodiment, the first semiconductor channel layer 46 and the first metal layer 45A may react, and thus a titanium silicide may be formed. A first semiconductor channel layer 46 including a polysilicon layer 46B and the metal silicide layer 46A positioned between the polysilicon layer 46B and the metal channel layer 45 may be formed.

Subsequently, an insulating core 47 may be formed in the first semiconductor channel layer 46. The second opening OP2 may be filled by the insulating core 47. The insulating core 47 may include an insulating material such as, for example, polysilazane (PSZ), oxide, or nitride.

Subsequently, the first material layers 41 may be replaced with third material layers 49. In an embodiment, after forming third openings OP3 by removing the first material layers 41, the third material layers 49 may be formed in the third openings OP3. The third material layers 49 may be a gate line and may include a conductive material such as, for example, metal. After forming a barrier layer 49A in the third opening P3, a metal layer 49B may be formed in the barrier layer 49A. The barrier layer 49A may include titanium nitride (TIN), and the metal layer 49B may include tungsten (W).

Through this, the gate structure GST including the second material layers 42 and the third material layers 49 alternately stacked may be formed. The ferroelectric memory cells may be formed in a region where the third material layers 49 and the metal channel layer 45 cross, and the drain select transistor may be formed in a region where the first semiconductor channel layer 46 and the third material layer 49 cross.

When the first material layers 41 include a conductive material, a process of replacing the first material layers 41 with the third material layers 49 may be omitted. In this case, the first material layers 41 may be used as the gate line, and the stack ST may be used as the gate structure GST.

According to the manufacturing method described above, the ferroelectric memory cells including the metal channel layer 45 and the drain select transistor including the first semiconductor channel layer 46 may be formed.

Figure 5:
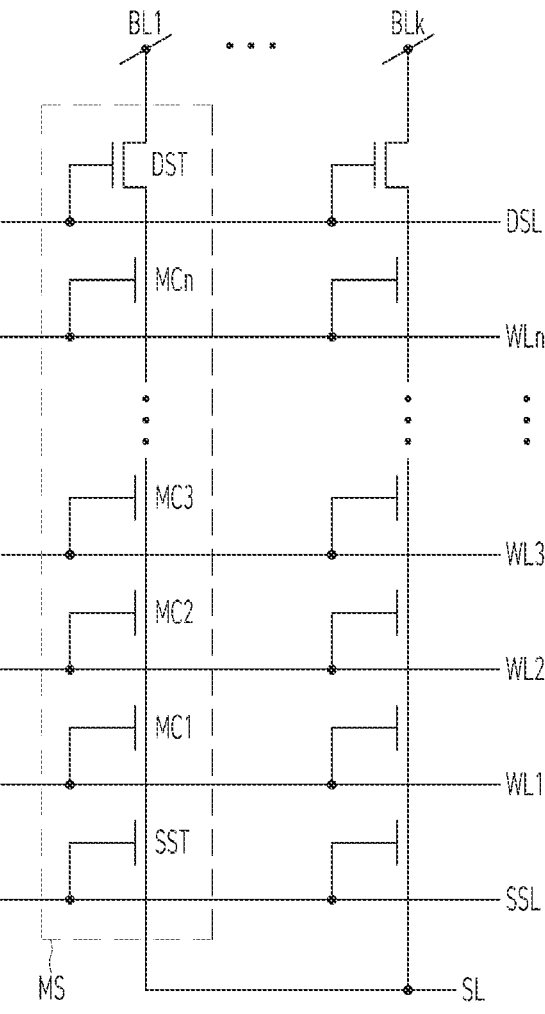
FIG. 5 is a circuit diagram illustrating a cell array of a semiconductor device according to an embodiment of the present disclosure.

FIG. 5 is a circuit diagram illustrating a cell array of a semiconductor device according to an embodiment of the present disclosure. Hereinafter, a description overlapping a content described above may be omitted.

Referring to FIG. 5, the semiconductor device may include bit lines BL1 to BLk, memory strings MS, word lines WL1 to WLn, a drain select line DSL, and a source select line SSL. The semiconductor device may further include a source line SL, and the memory strings MS may be connected between a bit line BL and the source line SL.

Each of the memory strings MS may include at least one drain select transistor DST, a plurality of ferroelectric memory cells MC1 to MCn, and at least one source select transistor SST. The ferroelectric memory cells MC1 to MCn may be FTJ elements. The word lines WL1 to WLn may be connected to gate electrodes of the ferroelectric memory cells MC1 to MCn. Drain select lines DSL may be connected to gate electrodes of the drain select transistors DST. Source select lines SSL may be connected to gate electrodes of the source select transistors SST. Here, k and n may be integers of 1 or more.

The drain select transistors DST may control a connection of the memory strings MS and the bit line BL. The drain select transistor DST may include a first semiconductor channel layer. In an embodiment, the first semiconductor channel layer may include polysilicon.

The source select transistors SST may control a connection of the memory strings MS and the source line SL. The source select transistor SST may include a second semiconductor channel layer. In an embodiment, the second semiconductor channel layer may include polysilicon.

The ferroelectric memory cells MC1 to MCn may store data according to a polarization state of the ferroelectric layer. The ferroelectric memory cells MC1 to MCn may include a channel layer having carrier mobility greater than that of the first semiconductor channel layer and/or the second semiconductor channel layer. The ferroelectric memory cells MC1 to MCn may include a metal channel layer. In an embodiment, the metal channel layer may include a metal such as, for example, titanium or tungsten.

According to the configuration described above, a memory integration degree of the semiconductor device may be increased by increasing the number of ferroelectric memory cells MC1 to MCn included in the memory string MS. Because the ferroelectric memory cells MC1 to MCn include a metal channel layer having great carrier mobility, an operation speed may be improved. A selected memory string and an unselected memory string may be distinguished and operated, by using the drain select transistor DST as a switch. In addition, a connection of the memory string MS and the source line SL may be controlled, by using the source select transistor SST as a switch.

Figure 6A:
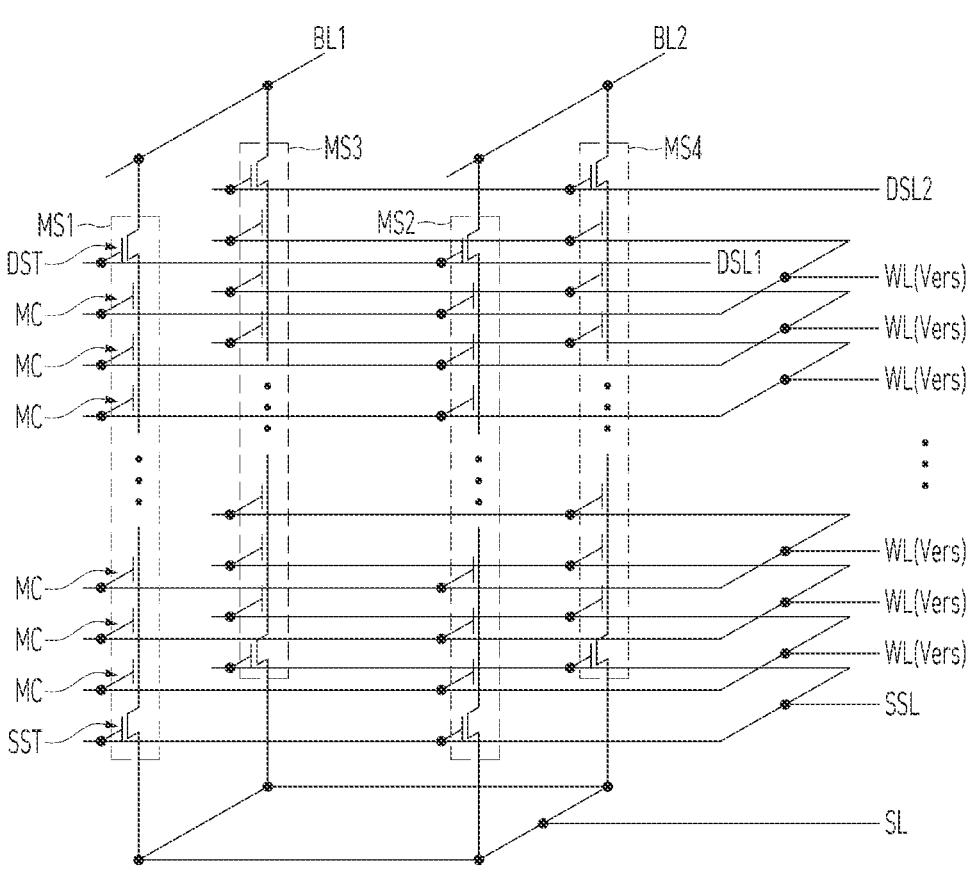
FIGS. 6A and 6B are diagrams illustrating a method of operating a semiconductor device according to an embodiment of the present disclosure.
Figure 6B:
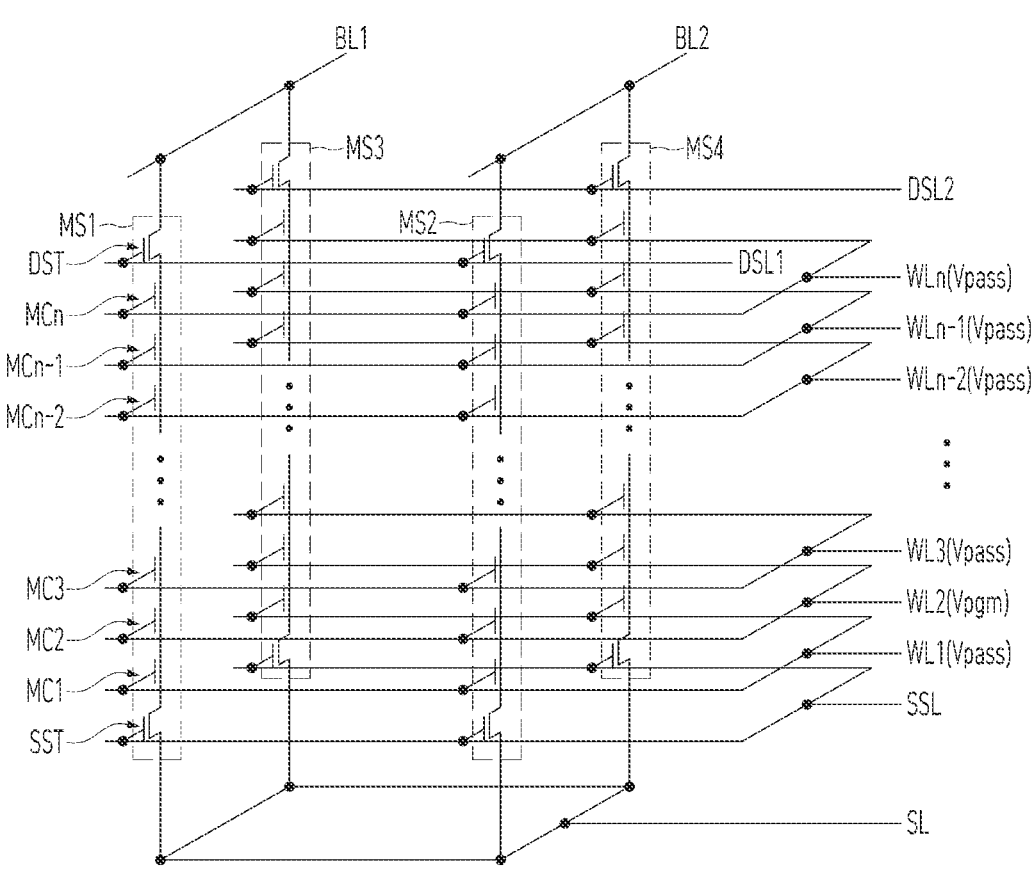

FIGS. 6A and 6B are diagrams illustrating a method of operating a semiconductor device according to an embodiment of the present disclosure. Hereinafter, a description overlapping a content described above may be omitted.

Referring to FIG. 6A, during an erase operation, a turn-on voltage may be applied to drain select lines DSL1 and DSL2 and a ground voltage may be applied to bit lines BL1 and BL2. The turn-on voltage may be applied to a source select line SSL, and the ground voltage may be applied to a source line SL. Through this, memory strings MS1 to MS4 may be connected to the bit lines BL1 and BL2 and the source line SL of a ground level, and a channel potential of the memory strings MS1 to MS4 may have the ground level. An erase voltage Vers may be applied to the word lines WL1 to WLn. Through this, the ferroelectric layer of the ferroelectric memory cells MC1 to MCn may have a first polarization state. Therefore, an erase operation may be performed on all memory strings MS1 to MS4 belonging to a memory block.

Referring to FIG. 6B, the ground voltage may be applied to the source select line SSL, and a source voltage having a level higher than the ground level may be applied to the source line SL. Here, the source voltage may be about 2V. Through this, the source select transistors SST may be turned off. The turn-on voltage may be applied to a selected first drain select line DSL1 and a first bit line voltage may be applied to a selected first bit line BL1. Here, the first bit line voltage may be the ground voltage. Through this, a channel potential of a selected first memory string MS1 may have the ground level.

A program voltage Vpgm may be applied to a selected word line WL2, and a pass voltage Vpass may be applied to unselected word lines WL1 and WL3 to WLn. Here, the pass voltage Vpass may be Vpgm/2. Through this, a ferroelectric layer of the selected second memory cell MC2 may have a second polarization state. Therefore, a program operation may be performed on the selected second memory cell MC2.

Among unselected memory strings MS2 to MS4, the second memory string MS2 may share the first drain select line DSL1 with the selected first memory string MS1 and might not share the first bit line BL1. Therefore, the second bit line voltage higher than the first bit line voltage may be applied to an unselected second bit line BL2. Here, the second bit line voltage may be an operation voltage Vcc. Through this, the drain select transistor DST may be turned off and a channel of the second memory string MS2 may be floated. The floated channel may be boosted relative to the program voltage Vpgm and the pass voltage Vpass, and may inhibit a program operation of the unselected second memory string MS2.

Among the unselected memory strings MS2 to MS4, the third memory string MS3 might not share the first drain select line DSL1 with the selected first memory string MS1, and may share the first bit line BL1. Therefore, the ground voltage may be applied to an unselected second drain select line DSL2, and may inhibit a program operation of the unselected third memory string MS3.

Among the unselected memory strings MS2 to MS4, the fourth memory string MS4 might not share the first drain select line DSL1 with the selected first memory string MS1, and might not share the first bit line BL1. The ground voltage may be applied to the unselected second drain select line DSL2, and the second bit line voltage higher than the first bit line voltage may be applied to the unselected second bit line BL2. In an embodiment, the second bit line voltage may be Vpgm/2. Through this, a program operation of the unselected fourth memory string MS4 may be inhibited.

Figure 7:
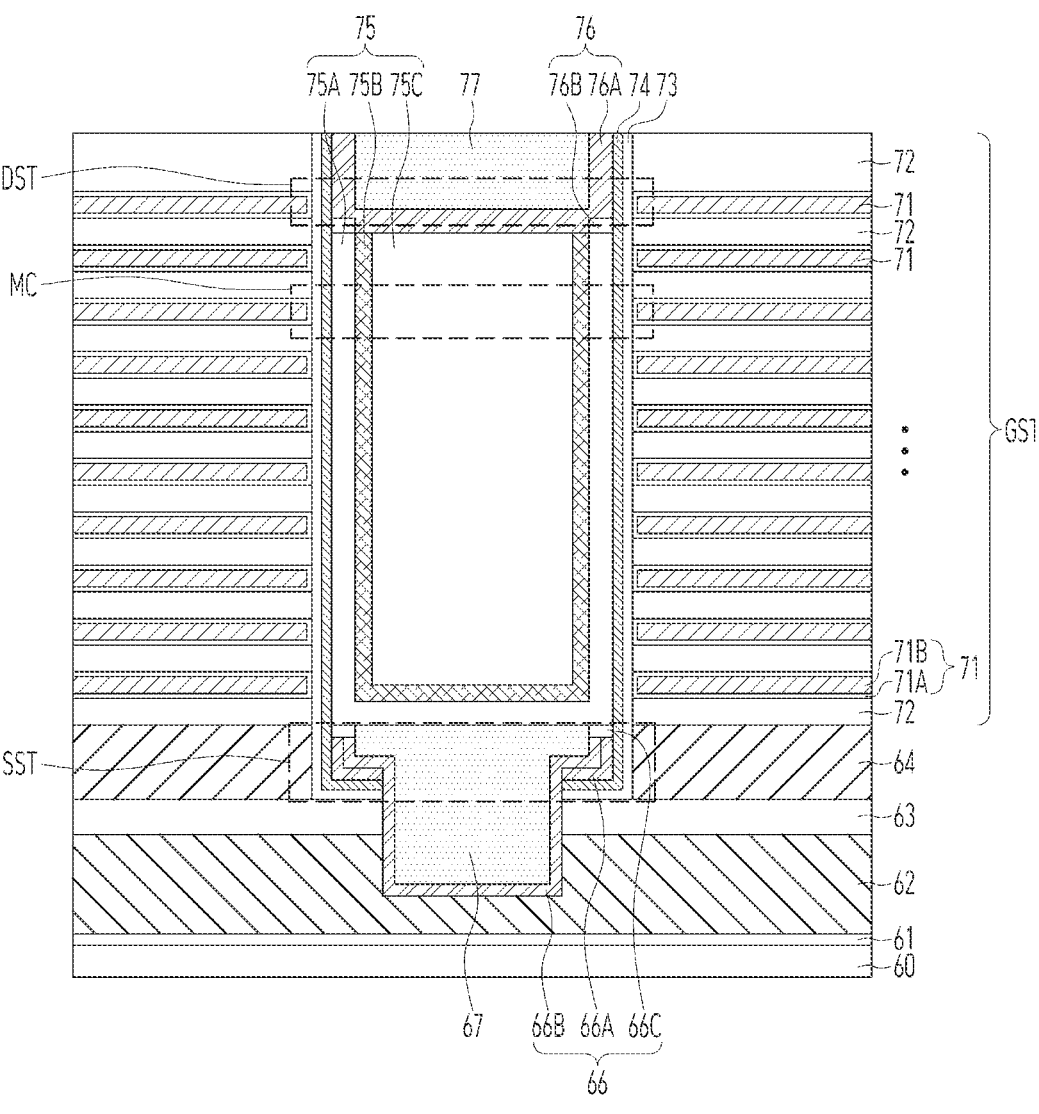
FIG. 7 is a diagram illustrating a structure of a semiconductor device according to an embodiment of the present disclosure.

FIG. 7 is a diagram illustrating a structure of a semiconductor device according to an embodiment of the present disclosure. Hereinafter, a description overlapping a content described above may be omitted.

Referring to FIG. 7, the semiconductor device may include a gate structure GST, a metal channel layer 75, a first semiconductor channel layer 76, and a ferroelectric layer 74. The semiconductor device may include at least one of a substrate 60, an insulating layer 61, a source line 62, a buffer layer 63, a source select line 64, a second semiconductor channel layer 66, a second insulating core 67, and an interface layer 73, and a first insulating core 77.

The gate structure GST may include conductive layers 71 and insulating layers 72 alternately stacked. In an embodiment, the conductive layers 71 may be a word line or a drain select line. The conductive layer 71 may include a barrier layer 71A and a metal layer 71B in the barrier layer 71A.

The source line 62 may be positioned between the substrate 70 and the gate structure GST. The source line 62 may include a conductive material such as, for example, polysilicon. The source select line 64 may be positioned between the source line 62 and the gate structure GST. The source select line 64 may include a conductive material such as, for example, polysilicon. The buffer layer 63 may be positioned between the source line 62 and the source select line 64. The buffer layer 63 may insulate the source line 62 and the source select line 64 from each other, and may include an insulating material such as, for example, oxide. The insulating layer 61 may be positioned between the substrate 60 and the source line 62. The insulating layer 61 may insulate the substrate 60 and the source line 62 from each other, and may include an insulating material such as, for example, oxide.

The metal channel layer 75 may extend through the gate structure GST. The metal channel layer 75 may include a first metal layer 75A, a barrier layer 75B, and a second metal layer 75C. The barrier layer 75B may surround the second metal layer 75C, and the first metal layer 75A may surround the barrier layer 75B. In an embodiment, the first metal layer 75A may include titanium (Ti), the barrier layer 75B may include a metal nitride such as, for example, titanium nitride (TiN), and the second metal layer 75C may include tungsten (W).

The first semiconductor channel layer 76 may extend through the gate structure GST and may be connected to the metal channel layer 75. The first semiconductor channel layer 76 may include a polysilicon layer 76A and a metal silicide layer 76B. The metal silicide layer 76B may be positioned between the polysilicon layer 76A and the metal channel layer 75. The first insulating core 77 may be positioned in the first semiconductor channel layer 76.

The second semiconductor channel layer 66 may extend through the source select line 64 and may be connected to the metal channel layer 75 and the source line 62. The second semiconductor channel layer 66 may pass through the source select line 64 and the buffer layer 63 and may extend into the source line 62. The second insulating core 67 may be positioned in the second semiconductor channel layer 66.

The second semiconductor channel layer 66 may include a first semiconductor pattern 66A and a second semiconductor pattern 66B. The second semiconductor pattern 66B may connect the source line 62 and the metal channel layer 75. The first semiconductor pattern 66A may partially surround a sidewall of the second semiconductor pattern 66B. The first semiconductor pattern 66A may be positioned between the second semiconductor pattern 66B and the ferroelectric layer 74.

The second semiconductor channel layer 66 may include polysilicon. The second semiconductor channel layer 66 may include a metal silicide layer 66C positioned in a portion contacting the metal channel layer 75. Through this, an ohmic contact may be formed between the second semiconductor channel layer 66 and the metal channel layer 75.

The ferroelectric layer 74 may surround the first semiconductor channel layer 76, the metal channel layer 75, and the second semiconductor channel layer 66. The ferroelectric layer 74 may surround the first semiconductor pattern 66A and expose the second semiconductor pattern 66B. The interface layer 73 may surround the ferroelectric layer 74 and expose the second semiconductor pattern 66B.

According to the structure described above, the ferroelectric memory cells MC may be positioned in a region where the metal channel layer 75 and the conductive layers 71 cross. The drain select transistor DST may be positioned in a region where the first semiconductor channel layer 76 and the conductive layers 71 cross. The source select transistor SST may be positioned in a region where the second semiconductor channel layer 66 and the source select line 64 cross. At least one source select transistor SST, the stacked ferroelectric memory cells MC, and at least one drain select transistor DST, which are stacked along the second semiconductor channel layer 66, the metal channel layer 75, and the first semiconductor channel layer 76, may configure one memory string.

FIGS. 8A to 8F are diagrams illustrating a method of manufacturing a semiconductor device according to an embodiment of the present disclosure. Hereinafter, a description overlapping a content described above may be omitted.

Figure 8A:
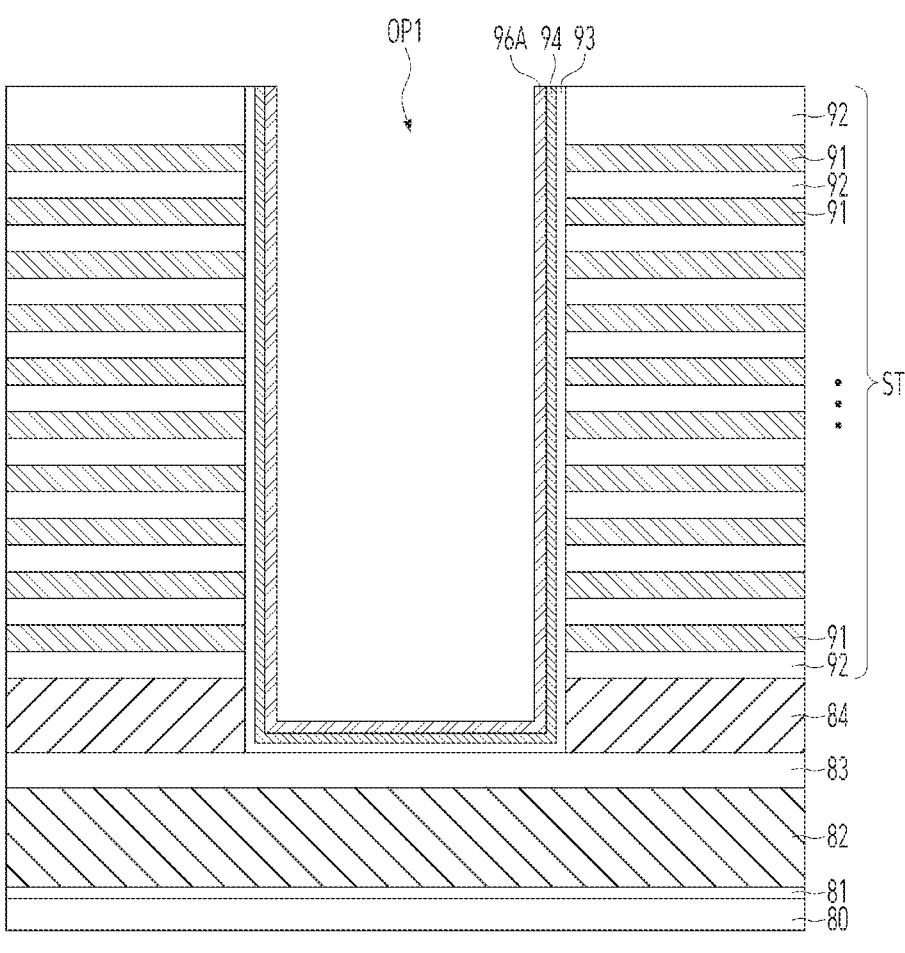
FIGS. 8A to 8F are diagrams illustrating a method of manufacturing a semiconductor device according to an embodiment of the present disclosure.

Referring to FIG. 8A, an insulating layer 81, a source line 82, a buffer layer 83, and a source select line 84 may be formed over a substrate 80 in the recited order. The insulating layer 81 may be formed on the substrate 80. The insulating layer 81 may cover the top surface of the substrate 80. The source line 82 may include polysilicon, the buffer layer 83 may include oxide, and the source select line 84 may include polysilicon. The thicknesses of the insulating layer 81, the source line 82, the buffer layer 83, and the source select line 84 may be substantially the same or different. For example, as illustrated in FIG. 8A the insulating layer 81 may be the thinnest of the four, the source line may be the thickest of the four, and the buffer layer 83 may be thinner than the source select line 84.

Subsequently, a stack ST may be formed on the source select line 84. The stack ST may include first material layers 91 and second material layers 92 alternately stacked. The first material layers 91 may be for forming gate lines such as, for example, word lines and a drain select line. The first material layers 91 may include a sacrificial material such as, for example, nitride, or may include a conductive material such as, for example, polysilicon or metal. The second material layers 92 may insulate the stacked gate lines from each other. The second material layers 92 may include an insulating material such as, for example, oxide, nitride, or a void. The lowest and the uppermost layers of the stack ST may be second material layers 92 and may insulate the stack ST from the source select line 84 and from a structure to be positioned over the stack ST.

Subsequently, a first opening OP1 may be formed in the stack ST. The first opening OP1 may extend into the source select line 84 through the stack ST. The first opening OP1 may have a depth that exposes the buffer layer 83.

Subsequently, an interface layer 93 may be formed in the first opening OP1. The interface layer 93 may be formed conformally along an inner surface of the first opening OP1. The interface layer 93 may be formed on an inner wall and a lower surface of the first opening OP1. The interface layer 93 may include a dielectric material such as, for example, tantalum oxide ($Ta_2O_5$).

Subsequently, a ferroelectric layer 94 may be formed in the first opening OP1. The ferroelectric layer 94 may be formed conformally along a profile of the interface layer 93. The ferroelectric layer 94 may be formed on the inner wall and the lower surface of the first opening OP1.

Subsequently, a first semiconductor pattern 96A may be formed in the first opening OP1. The first semiconductor pattern 96A may be formed conformally along a profile of the ferroelectric layer 94. The first semiconductor pattern 96A may be formed on the inner wall and the lower surface of the first opening OP1.

Figure 8B:
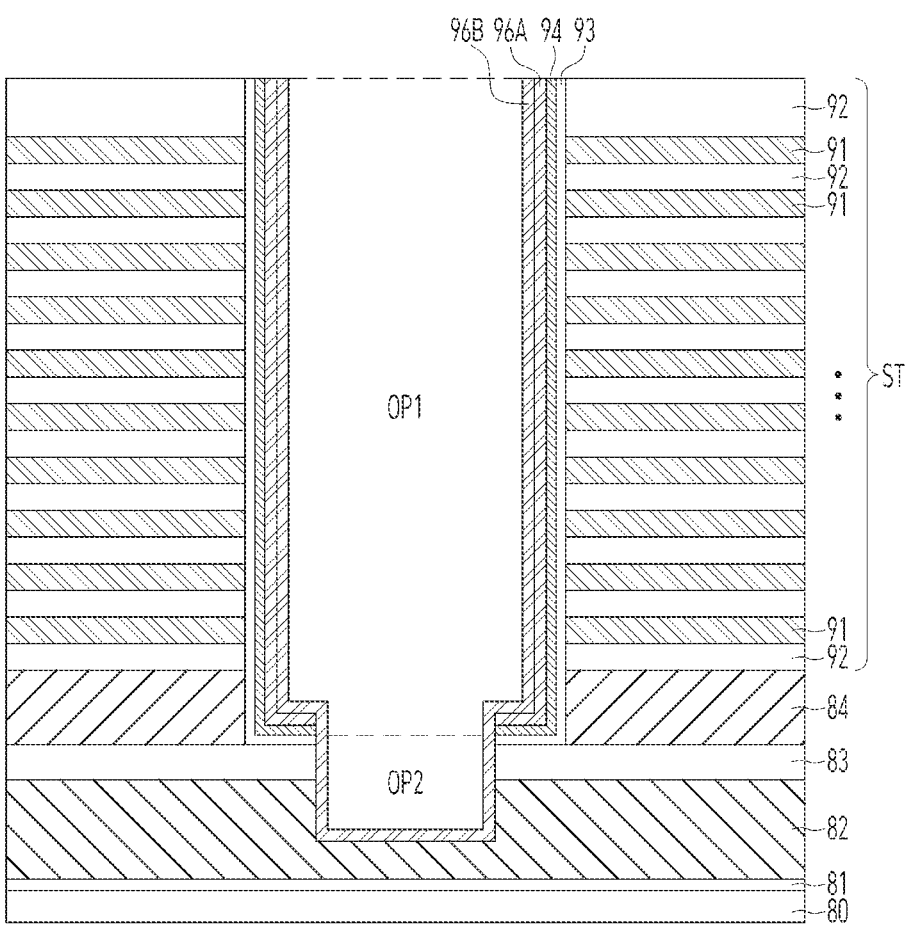

Referring to FIG. 8B, a second opening OP2 may be formed. The buffer layer 83 may be exposed by etching the first semiconductor pattern 96A, the ferroelectric layer 94, and the interface layer 93, and the second opening OP2 may be formed by etching the buffer layer 83. The second opening OP2 may expose the source line 82 and may extend into the source line 82. Through this, an opening passing through the stack ST, the source select line 84, and the buffer layer 83, and exposing the source line 82 may be formed.

Subsequently, a second semiconductor pattern 96B may be formed in the first opening OP1 and the second opening OP2. The second semiconductor pattern 96B may be formed conformally along a profile of the first semiconductor pattern 96A and may be formed on an inner wall and a lower surface of the second opening OP2. The second semiconductor pattern 96B may be connected to the source line 82.

Figure 8C:
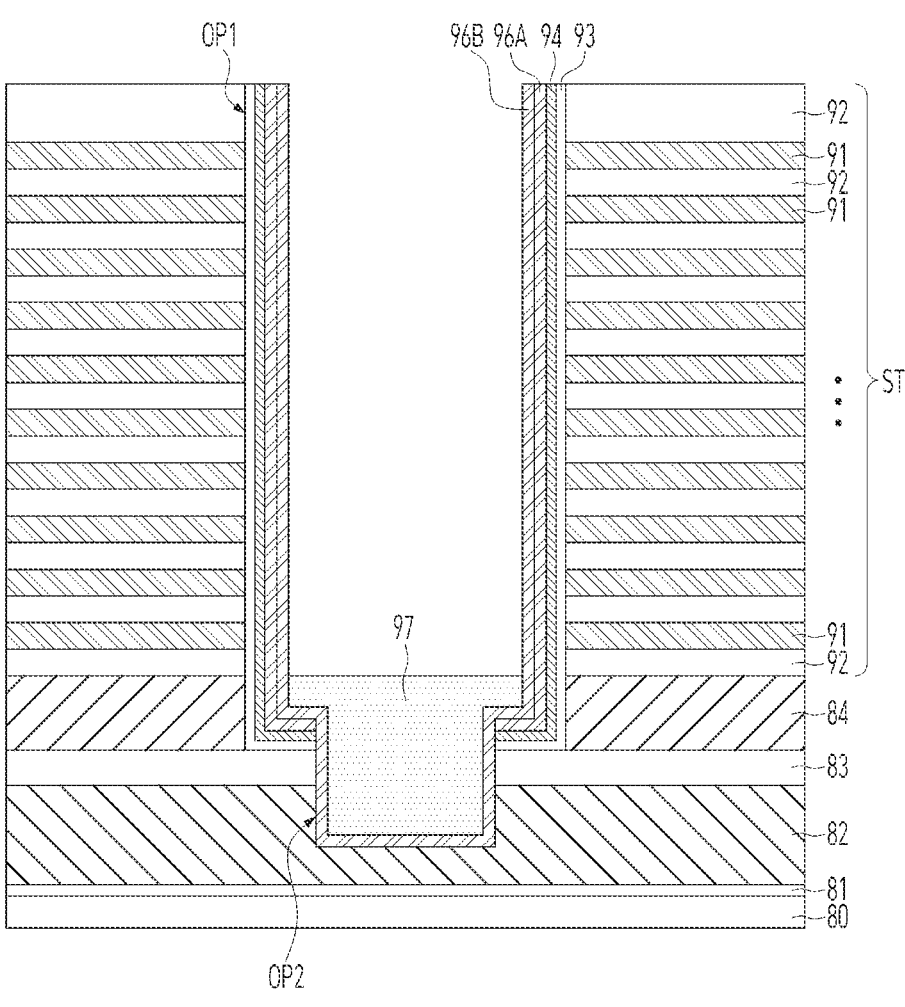

Referring to FIG. 8C, a second insulating core 97 may be formed in the second semiconductor pattern 96B. For example, first an insulating layer may be formed in the first and second openings OP1 and OP2, and then the second insulating core 97 may be formed by etching a portion of the insulating layer. The second insulating core 97 may fill the second opening OP2 and only a lower portion of the first opening OP1. An upper surface of the second insulating core 97 may be positioned to correspond to an upper surface of the source select line 84. The upper surface of the second insulating core 97 may be positioned at substantially the same level as the upper surface of the source select line 84.

Figure 8D:
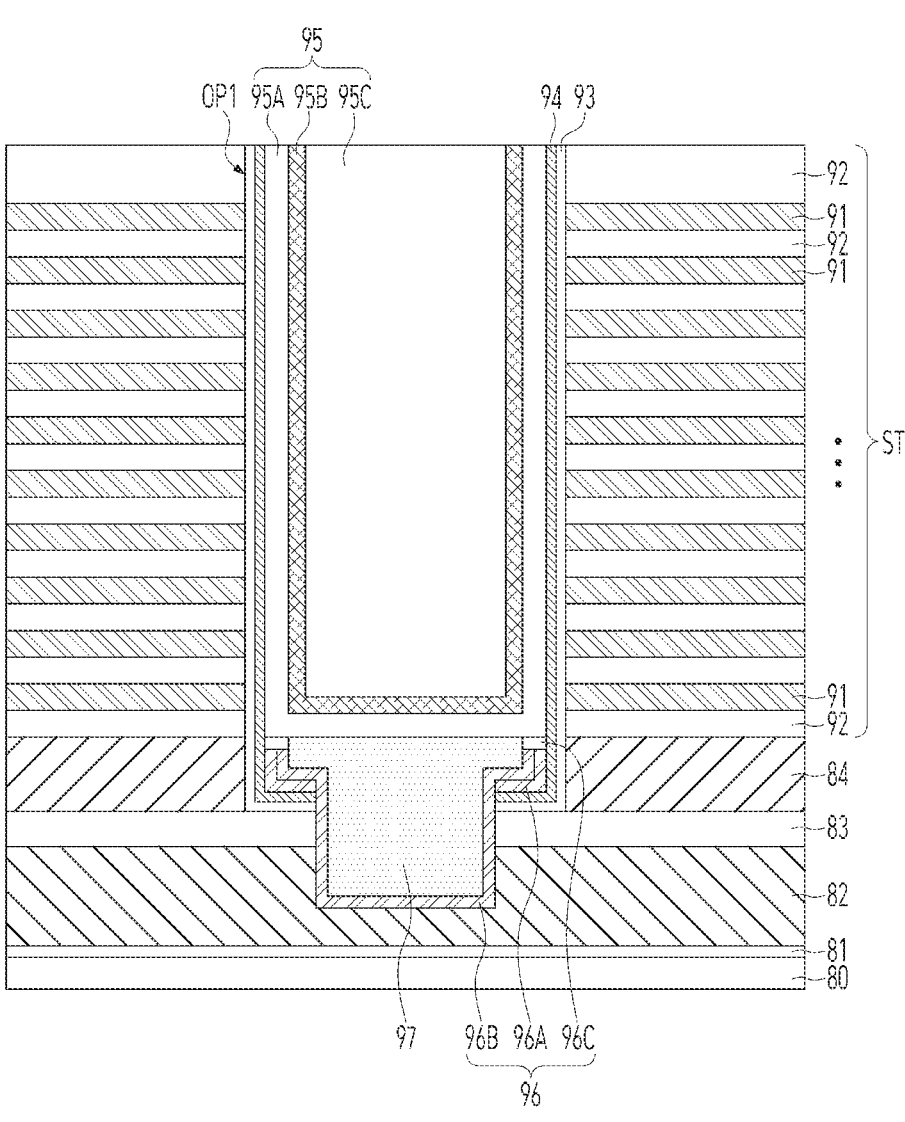

Referring now to FIG. 8D, the second semiconductor pattern 96B and the first semiconductor pattern 96A exposed by the second insulating core 97 may be etched. Hence, the portion of the first semiconductor pattern 96A and the second semiconductor pattern 96B corresponding to the stack ST (at the same level as the stack first and second material layers 91 and 92) may be removed by the etching. Hence, a second semiconductor channel layer 96 including the first semiconductor pattern 96A and the second semiconductor pattern 96B may be formed. The second semiconductor channel layer 96 may extend into the source line 82 through the source select line 84 and may be connected to the source line 82.

Subsequently, a metal channel layer 95 may be formed. First, the first metal layer 95A may be formed conformally along a profile of the ferroelectric layer 94, the second semiconductor channel layer 96, and the second insulating core 97 exposed through the first opening OP1. Subsequently, a barrier layer 95B may be formed in the first metal layer 95A, and a second metal layer 95C may be formed in the barrier layer 95B. The first metal layer 95A may be in contact with the second semiconductor channel layer 96. A portion of the second semiconductor channel layer 96, which is in contact with the first metal layer 95A may be silicided, and a metal silicide layer 96C may be formed.

Figure 8E:
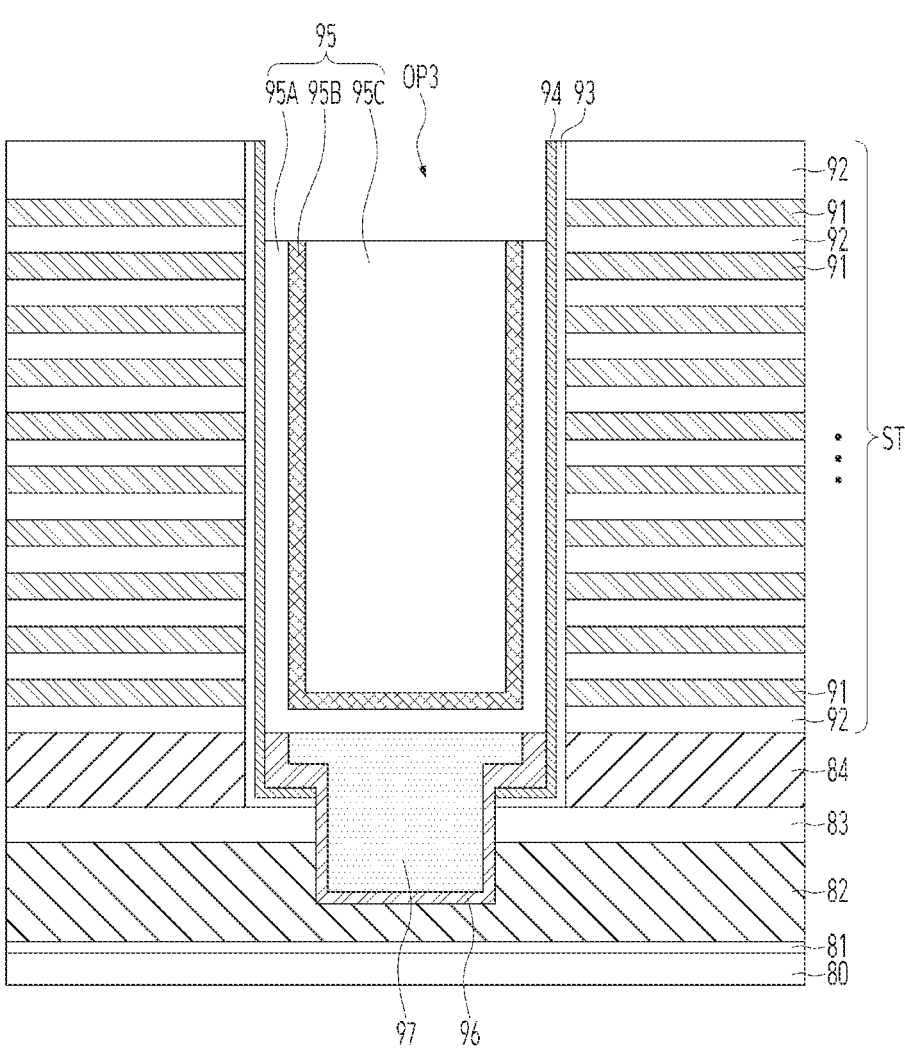

Referring to FIG. 8E, a third opening OP3 may be formed by etching a portion of the metal channel layer 95. A portion of the metal channel layer 95 corresponding to the drain select line may be removed, and an upper portion of the ferroelectric layer 94 may be exposed.

Figure 8F:
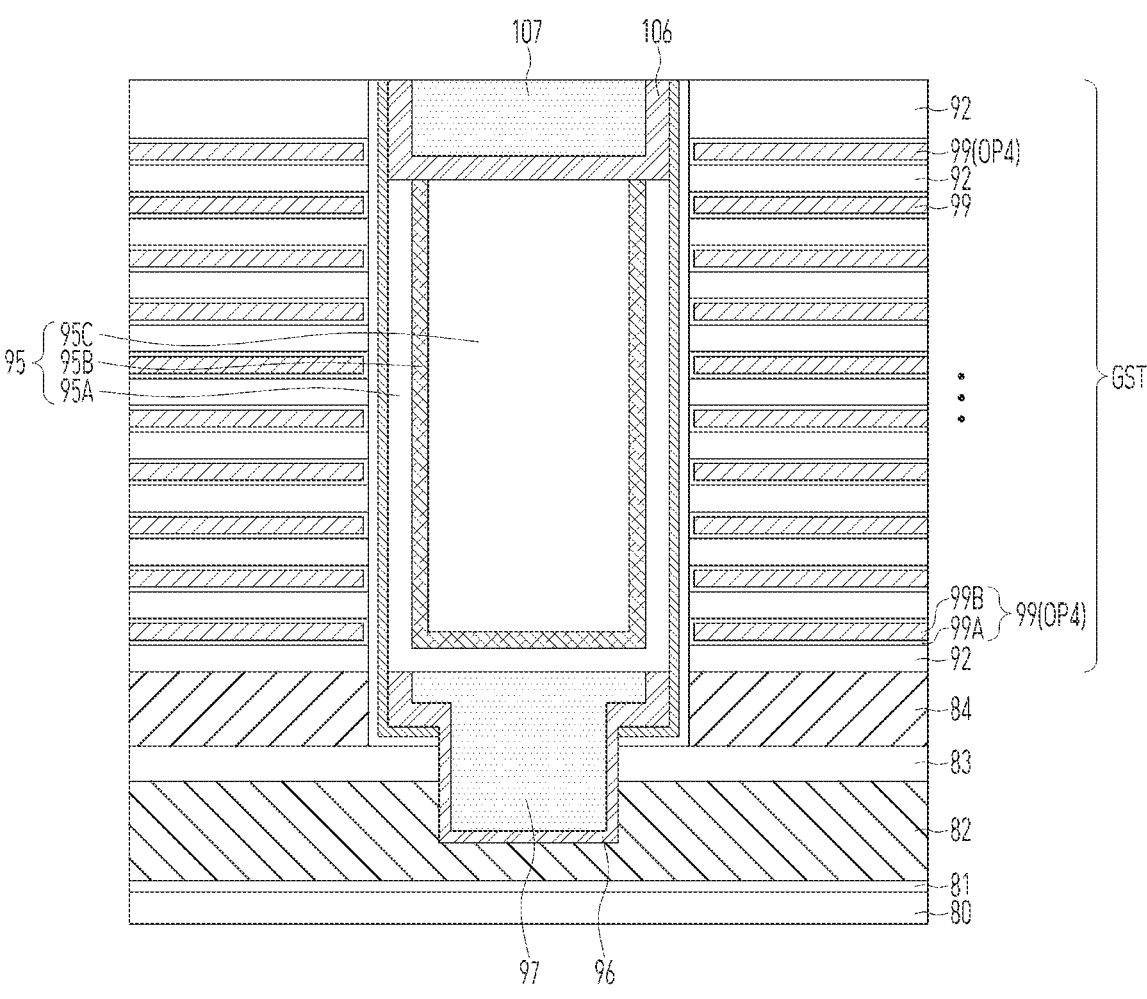

Referring to FIG. 8F, a first semiconductor channel layer 106 may be formed in the third opening OP3. The first semiconductor channel layer 106 may fill at least a portion of the third opening OP3. As illustrated in the embodiment of FIG. 8F, the first semiconductor channel layer 106 may be formed conformally along a profile of the ferroelectric layer 94 and the metal channel layer 95. A portion of the first semiconductor channel layer 106, which is in contact with the metal channel layer 95 may be silicided, and a metal silicide layer may be formed at an interface thereof. Subsequently, a first insulating core 107 may be formed in the remaining space of the third opening defined by the first semiconductor channel layer 106. Hence, the third opening OP3 may be filled by the first insulating core 107 and the first semiconductor channel layer 106.

Subsequently, the first material layers 91 may be replaced with third material layers 99. For example, in an embodiment, fourth openings OP4 may first be formed by removing the first material layers 91, and then the fourth openings may be filled with the third material layers 99. After forming the barrier layer 99A in the fourth opening OP4, a metal layer 99B may be formed in the barrier layer 99A. The barrier layer 99A may include titanium nitride (TiN), and the metal layer 99B may include tungsten (W).

Following the above operations, a gate structure GST may be formed which includes the second and third material layers 92 and 99 alternately stacked. A source select transistor may be formed in a region where the source select line 84 and the second semiconductor channel layer 96 cross. Ferroelectric memory cells may be formed in a region where the third material layers 99 and the metal channel layer 95 cross. A drain select transistor may be formed in a region where the first semiconductor channel layer 106 and the third material layers 99 cross. When the first material layers 91 include a conductive material, a process of replacing the first material layers 91 with the third material layers 99 may be omitted. In this case, the first material layers 91 may be used as the gate line, and the stack ST may be used as the gate structure GST. In addition, at least one of the insulating layer 81, the source line 82, the buffer layer 83, and the source select line 84 may be omitted.

According to the manufacturing method described above, the source select transistor including the second semiconductor channel layer 96, the ferroelectric memory cells including the metal channel layer 95, and the drain select transistor including the first semiconductor channel layer 106 may be formed.

Although embodiments according to the technical spirit of the present disclosure have been described with reference to the accompanying drawings, this is only for describing an embodiment according to the concept of the present disclosure, and the scope of the present disclosure is not limited to the above-described embodiments. Within the scope of the technical spirit of the present disclosure, various forms of substitution, modification, change, and combination of the embodiments will be possible by those skilled in the art to which the present disclosure belongs, and these also are included in the scope of the present disclosure.

What is claimed is:

1. A semiconductor device comprising:
   a gate structure including conductive layers and insulating layers alternately stacked;
   a metal channel layer extending through the gate structure;
   a first semiconductor channel layer positioned in the gate structure and connecting to the metal channel layer; and
   a ferroelectric layer surrounding the metal channel layer and the first semiconductor channel layer.

2. The semiconductor device of claim 1, wherein a drain select transistor is positioned in a region where the first semiconductor channel layer and the conductive layers cross, and
   ferroelectric memory cells are positioned in a region where the metal channel layer and the conductive layers cross.

3. The semiconductor device of claim 1, wherein the first semiconductor channel layer comprises:
   a polysilicon layer; and
   a metal silicide layer positioned between the polysilicon layer and the metal channel layer.

4. The semiconductor device of claim 1, further comprising:
   a source line;
   a source select line positioned between the source line and the gate structure; and
   a second semiconductor channel layer extending through the source select line and connecting to the metal channel layer and the source line.

5. The semiconductor device of claim 4, wherein a drain select transistor is positioned in a region where the first semiconductor channel layer and the conductive layers cross,
   a source select transistor is positioned in a region where the second semiconductor channel layer and the source select line cross, and
   ferroelectric memory cells are positioned in a region where the metal channel layer and the conductive layers cross.

6. The semiconductor device of claim 4, wherein the conductive layers include metal, and the source select line includes polysilicon.

7. The semiconductor device of claim 1, further comprising:
   an interface layer surrounding the ferroelectric layer.

8. The semiconductor device of claim 7, wherein the interface layer includes tantalum oxide ($Ta_2O_5$).

9. The semiconductor device of claim 1, further comprising:
   an insulating core positioned in the first semiconductor channel layer.

10. The semiconductor device of claim 9, wherein the first semiconductor channel layer surrounds a sidewall of the insulating core and extends between the metal channel layer and the insulating core.

11. A semiconductor device comprising:
    bit lines;
    memory strings including ferroelectric memory cells including a metal channel layer and a drain select transistor including a first semiconductor channel layer;
    word lines connected to the ferroelectric memory cells; and
    drain select lines connected to the drain select transistor and controlling a connection of the memory strings and the bit lines.

12. The semiconductor device of claim 11, wherein a negative erase voltage is applied to the word lines during an erase operation.

13. The semiconductor device of claim 12, wherein a turn-on voltage is applied to the drain select lines and a ground voltage is applied to the bit line during the erase operation.

14. The semiconductor device of claim 11, wherein a program voltage is applied to a selected word line among the word lines and a pass voltage is applied to unselected word lines during a program operation.

15. The semiconductor device of claim 14, wherein a first bit line voltage is applied to a selected bit line among the bit lines and a second bit line voltage of a level higher than that of the first bit line voltage is applied to unselected bit lines during the program operation.

16. The semiconductor device of claim 15, wherein the first bit line voltage is a ground voltage.

17. The semiconductor device of claim 15, wherein a turn-on voltage is applied to a selected drain select line among the drain select lines and a ground voltage is applied to unselected drain select lines during the program operation.

18. The semiconductor device of claim 11, further comprising:
a source line; and
a source select line controlling a connection of the source line and the memory strings,

wherein each of the memory strings includes a source select transistor including a second semiconductor channel layer.

19. The semiconductor device of claim 18, wherein a turn-on voltage is applied to the source select line and a ground voltage is applied to the source line during an erase operation.

20. The semiconductor device of claim 18, wherein a ground voltage is applied to the source select line during a program operation.

21. A semiconductor device comprising:
a gate structure including conductive layers and insulating layers alternately stacked;
a ferroelectric layer passing through the gate structure;
a metal channel layer extending through a lower portion of the gate structure; and
a first semiconductor channel layer extending through an upper portion of the gate structure, the first semiconductor channel layer being positioned over the metal channel layer with a lower surface of the first semiconductor channel layer contacting an upper surface of the metal channel layer,
wherein the ferroelectric layer laterally surrounds a side of the metal channel layer and a side of the first semiconductor channel layer.

* * * * *